(12) United States Patent  (10) Patent No.: US 6,995,625 B2
Chien  (45) Date of Patent: Feb. 7, 2006

(54) OSCILLATOR WITH QUADRATURE OUTPUT IN A CROSS-COUPLED CONFIGURATION

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 10/813,261

(22) Filed: Mar. 31, 2004

(65) Prior Publication Data

US 2005/0225403 A1    Oct. 13, 2005

(51) Int. Cl.
H03B 5/20 (2006.01)
H03B 27/00 (2006.01)
H04B 1/26 (2006.01)
H04B 1/38 (2006.01)

(52) U.S. Cl. ............... 331/135; 331/45; 331/137; 331/177 V; 455/73; 455/255; 455/318

(58) Field of Classification Search ............ 331/45, 331/108 B, 108 C, 135, 136, 137, 177 V; 455/73, 77, 255, 313, 318
See application file for complete search history.

(56) References Cited

U.S. PATENT DOCUMENTS 3,416,100 A   12/1968  Kruse, Jr., et al.
3,667,067 A * 5/1972  Levell ........................ 331/59
5,185,581 A * 2/1993  Brown ....................... 330/254
5,610,560 A   3/1997  Sauer et al.

FOREIGN PATENT DOCUMENTS

EP          0371549       11/1989
WO     WO 02/065631      8/2002

OTHER PUBLICATIONS

Miller, et al., *The Distributed RC Variable-Frequency Phase-Shift Oscillator*, Microelectron Reliab., vol. 17, pp. 457–460.
Van der Tang, et al., *Analysis and Design of an Optimally Coupled 5-GHz Quadrature LC Oscillator*, IEEE Journal of Solid-State Circuits, vol. 37, No. 5, May 2002.

* cited by examiner

*Primary Examiner*—David Mis
(74) *Attorney, Agent, or Firm*—Squire, Sanders & Dempsey L.L.P.

(57) ABSTRACT

An oscillator that provides a quadrature output and has a cross-coupled configuration is disclosed. The oscillator generates an output signal having a frequency. Two phase shift circuits, or stages, are activated by a control signal to provide phase shifts within the oscillator. Each phase shift circuit includes poles to provide the phase shift. A pole includes a varactor to tune, adjust or vary the phase shift accordingly.

30 Claims, 3 Drawing Sheets

OSCILLATOR WITH QUADRATURE OUTPUT IN A CROSS-COUPLED CONFIGURATION

BACKGROUND OF THE INVENTION

1. Field of the Invention

The present invention relates to oscillators on integrated chips or circuits within communication devices, and more particularly, the present invention relates to a varactor-based oscillator with quadrature output having a cross-coupled configuration for use in a communication device, such as a wireless networking device.

2. Description of the Related Art

The use of wireless communications for in-home and in-building networks, and direct communications is increasing in popularity. In conventional communication systems, data may be modulated onto at least one radio frequency (RF) carrier frequency and transmitted as a modulated signal. The transceiver receives the RF modulated signal and demodulates the signal to recapture the data. In wireless applications, the data is modulated and transmitted over a wireless network to another location. The wireless device, or user equipment, receives the signal and demodulates it for an application.

Regardless of the communication system or device, a transceiver generally includes an antenna, a filtering section, a low noise amplifier, an intermediate frequency (IF) stage and a demodulator. The antenna receives RF modulated signals and provides the signals to the filtering section. The filtering section may pass the RF signals of interest to the low noise amplifier. The low noise amplifier amplifies the received RF signals of interest and provides the amplified signals to the IF stage. The IF stage may include one or more oscillators, mixers, or adders to step-down the frequency of the RF signals to an intermediate frequency signal, or baseband signal. The IF stage provides the IF, or base-band, signals to the demodulator. Depending upon a particular protocol, algorithm or method, the demodulator demodulates the signals to recapture the data for use in an application.

Some applications may use quadrature output signals from the oscillators. Like normal oscillators, these oscillators seek to output a signal having a specific frequency. Once the oscillator reaches the specified frequency, the oscillator may lock onto the frequency. If the oscillator does not generate the specified frequency, then the oscillator may be adjusted via feedback or other means until the specified frequency is achieved. A ring oscillator may be used having at least two stages to provide the quadrature output. Each stage may have phase shift with an overall phase shift of 360°.

By having two or more stages, a ring oscillator may generate increased noise as well as introduce potential phase shift errors. These actions degrade an output signal and prevent the oscillator from achieving a specified frequency noise. These actions also may prevent an adequate frequency range being generated for use in a variety of oscillation applications. Further, each stage of these oscillators increases delay in providing the output signal to the demodulator. Conventional oscillators may use current control by implementing a voltage-to-current converter to convert the control signal. A control voltage may be applied to the converter that outputs a current control signal to the oscillator. The added component of the converter may increase noise within this particular oscillator.

SUMMARY OF THE INVENTION

According to the preferred embodiments, an oscillator is disclosed. The oscillator includes a first phase shift circuit including a first hole having a first phase shift and a second pole having a second phase shift. The first phase shift circuit generates a first total phase shift that includes the first phase shift and the second phase shift. The oscillator also includes a second phase shift circuit including a third pole having a third phase shift and a fourth pole having a fourth phase shift. The second phase shift circuit generates a second total phase shift that includes the third phase shift and the fourth phase shift. An output of the first phase shift circuit is coupled to an input of the second phase shift circuit. An output of the second phase shift circuit is cross-coupled to an input of the first phase shift circuit.

An oscillator circuit having a cross-coupled configuration also is disclosed according to the preferred embodiments. The oscillator circuit includes a first phase shift circuit. The oscillator circuit also includes a second phase shift circuit to receive an output from the first phase shift circuit as an input and an output cross-coupled to an input of the first phase shift circuit. The oscillator circuit also includes at least one pole circuit of a plurality of poles within the first or the second phase shift circuit. The at least one pole circuit includes a varactor to vary a phase shift of the at least one pole circuit.

A transceiver to transmit and receive modulated signals also is disclosed according to the preferred embodiments. The transceiver includes a radio frequency receiver/transmitter. The transceiver also includes an intermediate frequency component coupled to the radio frequency receiver/transmitter to modify a signal to/from the radio frequency receiver/transmitter. The transceiver also includes an oscillating circuit within the intermediate frequency component to generate a quadrature output signal in response to the signal, and includes a phase shift circuit having a pole of a plurality of poles. The pole includes a varactor to adjust a phase shift generated by the phase shift circuit.

A method for adjusting a phase shift within a phase shift circuit and a cross-coupled oscillator also is disclosed according to the preferred embodiments. The method includes tuning a varactor in a pole within a phase shift circuit. The phase shift circuit is within an oscillator and coupled to another phase shift circuit. The method also includes changing a phase shift generated by the phase shift circuit according to the varactor.

A circuit for adjusting a phase shift circuit in a cross-coupled oscillator also is disclosed according to the preferred embodiments. The circuit includes tuning means for tuning a varactor in a pole within a phase shift circuit. The phase shift circuit is within an oscillator and coupled to another phase shift circuit. The circuit also includes changing means for changing a phase shift generated by the phase shift circuit according to the varactor.

BRIEF DESCRIPTION OF THE DRAWINGS:

For proper understanding of the invention, reference should be made to the accompanying drawings, wherein.

DETAILED DESCRIPTION OF THE PREFERRED EMBODIMENTS

Reference is now made to the above-disclosed figures to illustrate exemplary embodiments of the present invention. The exemplary embodiments are disclosed in greater detail according to this detailed description and to the appended drawings, wherein like numerals designate like elements.

Figure 1:
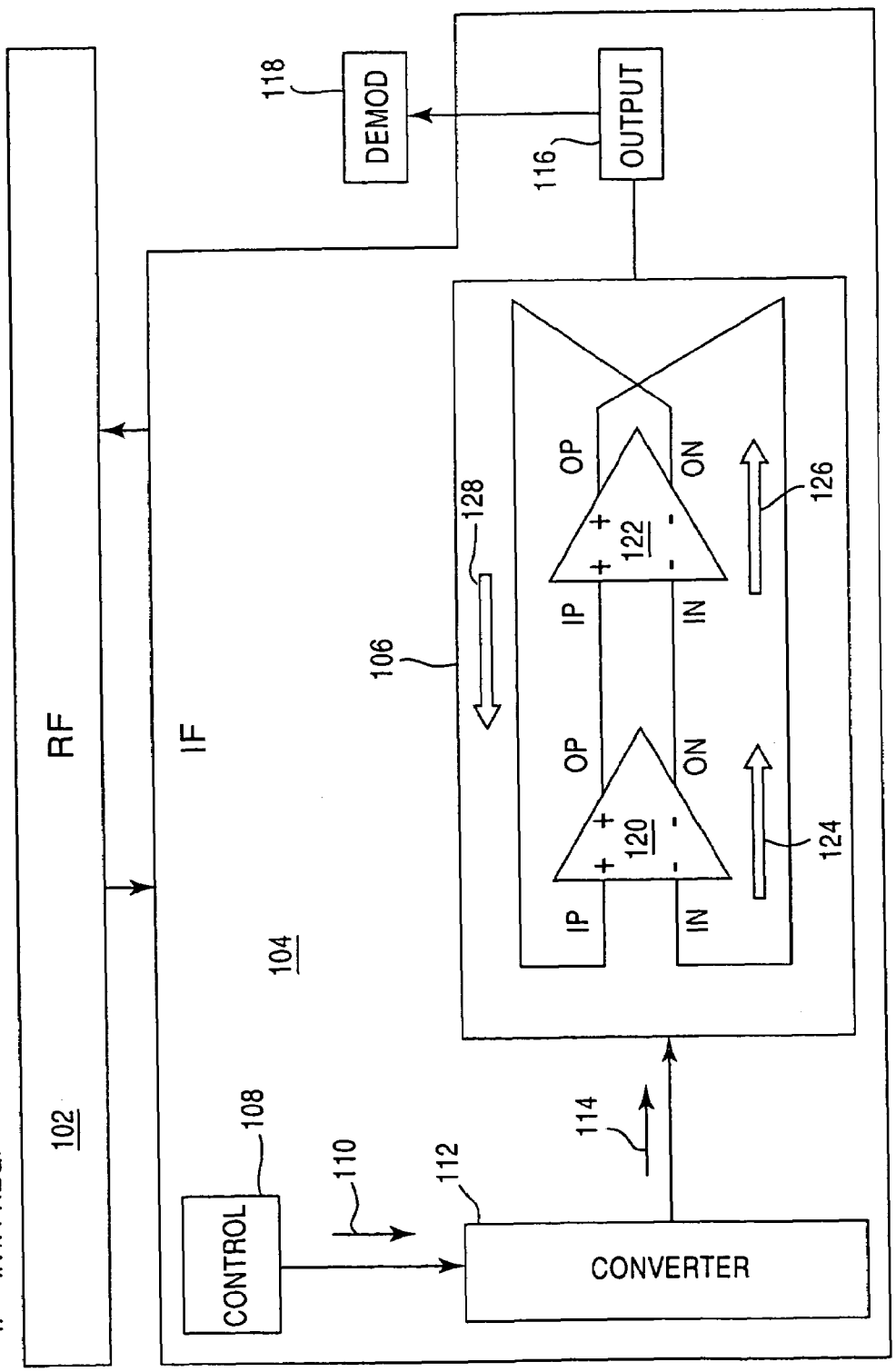
FIG. 1 illustrates a transceiver having a cross-coupled oscillating circuit according to the preferred embodiments.

FIG. 1 illustrates transceiver 100 having an oscillating circuit 106 according to the preferred embodiments. A transceiver 100 may be used in communication systems, devices, methods and the like. Transceiver 100 may be included in a wireless communication device to transmit and receive signals on a wireless network, or any other wireless communications. Transceiver 100 may receive/transmit RF signals that are converted and modulated, or demodulated. Transceiver 100 is disclosed in greater detail below by using an example of a signal received by RF receiver/transmitter 102. Alternatively, transceiver 100 also may send a signal via RF transmitter/receiver 102.

RF receiver/transmitter 102 may receive a signal from another source. Preferably, the signal arrives over a wireless communication network to an antenna coupled to RF receiver/transmitter 102. RF receiver/transmitter 102 may convert the received RF signal to an intermediate, or baseband, signal that allows for greater or increased processing.

The signal is sent to intermediate frequency (IF) component 104. IF component 104 may include oscillating circuit 106 to generate output signal 116 having a specified frequency desired within transceiver 100. IF component 104 may receive control signal 108 that specifies the desired frequency and also serves as a control signal to initiate output signal 116. Control signal 108 may comprise a voltage signal provided to oscillating circuit 106. Converter 112 may be included in oscillating circuit 106 to convert control signal 108 to a current signal, if desired.

Oscillating circuit 106 may include two stages, or phase shift circuits. Preferably, oscillating circuit 106 includes phase shift circuit 120 and phase shift circuit 122. Phase shift circuits 120 and 122 also may be referred to as delay cells. Phase shift circuit 120 generates phase shift 124. Phase shift circuit 122 generates phase shift 126. Phase shift circuit 120 and phase shift circuit 122 may be configured as cross-coupled stages within oscillating circuit 106. Phase shift 128 may be the cross-coupled phase shift produced by the cross-coupled configuration.

In the disclosed cross-coupled configuration, a positive output (OP) of phase shift circuit 120 may be coupled to a positive input (IP) of phase shift circuit 122. A negative output (ON) of phase shift circuit 120 may be coupled to a negative input (IN) of phase shift circuit 122. Thus, the output of phase shift circuit 120 may be coupled directly to the input of phase shift circuit 122. In addition, an OP of phase shift circuit may be cross-coupled to the IN of phase shift circuit 120. An ON of phase shift circuit 122 may be cross-coupled to an IP of phase shift circuit 120.

As disclosed above, phase shift circuits 120 and 122 may generate phase shifts 124 and 126, respectively. Phase shifts 124 and 126 may be approximately equal to cross-coupled phase shift 128. Preferably, cross-coupled phase shift 128 may be approximately 180°. Phase shifts 124 and 126 may have phase shifts of approximately 90° each. Phase shift circuits 120 and 122 can be adjusted, or tuned, to generate phase shifts 124 and 126. The total phase shift for oscillating circuit 106 may be approximately equal to 360°.

In an example, control signal 108 may be received by oscillating circuit 106. Oscillating circuit 106 may react to control signal 114 by generating output signal 116 according to a desired, or specified, frequency. Phase shift circuits 120 and 122 add phase shift in generating output signal 116. For example, phase shift circuits 120 and 122 are cross-coupled such that the total phase shift equals approximately 360°. Thus, output signal 116 may not be out of phase with control signal 108 or any other applicable signals.

Output signal 116 may be output to demodulator 118. IF component 104 also may use output frequency 116. Further, IF component 104 may include additional oscillating circuits 106 such that a plurality of oscillators are used to generate a variety of output signals 116. Oscillating circuit 106 preferably may be adjustable to provide different frequencies to transceiver 100.

Transceiver 100 may be implemented in an integrated circuit or chip. Preferably, transceiver 100 may be implemented on an integrated chip within a communication device for wireless communications. Further, transceiver 100 may operate at various frequencies to produce output signal 116 within various frequency ranges. Preferably, this frequency range may be less than 500 MHz. More preferably, transceiver 100 may operate within a frequency range of approximately 100 MHz to 200 MHz.

Figure 2:
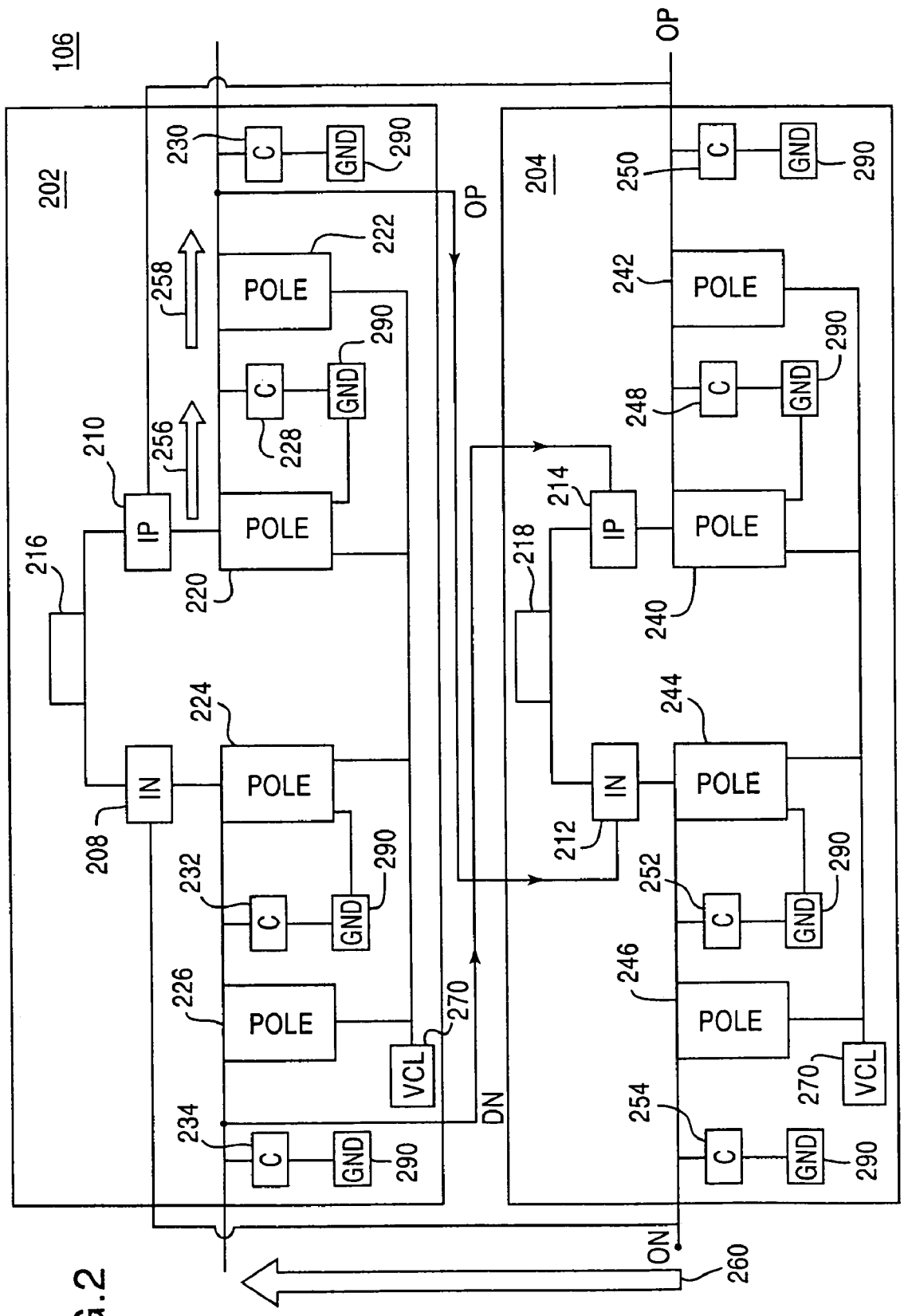
FIG. 2 illustrates an oscillating circuit according to the preferred embodiments.

FIG. 2 illustrates an oscillating circuit 106 according to the preferred embodiments. FIG. 2 may correlate to oscillating circuit 106 disclosed with reference to FIG. 1. FIG. 1, however, is not limited by the embodiments disclosed with reference to FIG. 2.

Oscillating circuit 106 of FIG. 2 includes phase shift circuits 202 and 204. Phase shift circuit 202 may be referred to as a second stage phase shift circuit. Phase shift circuit 204 may be referred to as a first stage phase shift circuit. Phase shift circuits 202 and 204 are cross-coupled such that the output, or OP and ON, of phase shift circuit 204 may be coupled directly to the inputs, or IP and IN, of phase shift circuit 202. The output, or OP and ON, of phase shift circuit 202 are cross-coupled to the input, or IP and IN, of phase shift circuit 204.

Phase shift circuit 202 may include IN gate 208 and IP gate 210. Gates 208 and 210 may be coupled to bias and supply ($V_{dd}$) voltages 216. Voltages 216 also may be any other standard voltages or signals applied to phase shift circuit 202 that enable operation of phase shift circuit 202. IN gate 208 may receive negative output from phase shift circuit 204. IP gate 210 receives positive output from phase shift circuit 204. Phase shift circuit 202 also may include poles 220, 222, 224 and 226. Phase shift circuit 202 also may include capacitances 228, 230, 232 and 234 coupled to ground 290. Preferably, poles 220, 222, 224 and 226 may generate a phase shift for phase shift circuit 202.

For example, referring to pole 220, phase shift 256 may be generated when pole 220 is activated by voltage control signal 270. Pole 220 also is coupled to capacitor 228. Pole 220 may be coupled to capacitance 228 in parallel. Pole 222 generates phase shift 258. Together, poles 220 and 222 generate a total phase shift that may equal the sum of phase shifts 256 and 258. Poles 220 and 222 may be adjustable to generate different phase shifts. The total phase shift, however, for poles 220 and 222 preferably remains approximately equal.

For example, the total phase shift generated by poles 220 and 222 may be approximately equal to one-half of phase shift 260. The total phase shift generated by poles 220 and 222 may be approximately equal to 90°. Phase shifts 256 and 258, however, are not limited to phase shift values of 45° or any other combination equaling 90°. For example, pole 220 may generate a phase shift 256 of 30°. Pole 222 may generate a phase shift 258 of 60°. In this example, pole 220 may be adjusted to generate a phase shift 256 of 50° and pole 222 may be adjusted to generate a phase shift 258 of 40°. Thus, according to the example, poles 220 and 222 may be adjusted and varied within phase shift circuit 202.

Poles 224 and 226 may act in a manner similar to poles 220 and 222. Poles 224 and 226 may generate phase shifts as well. When poles 220, 222, 224 and 226 receive voltage control signal 270, poles 220, 222, 224 and 226 generate the appropriate phase shifts according to the circuits comprising the poles 220–226. These circuits include components that may be adjusted as desired.

Phase shift circuit 204 may act similar to phase shift circuit 202. Phase shift circuit 204 includes s poles 240, 242, 244 and 246 that generate phase shifts similar to pole 220 within phase shift circuit 202. Phase shift circuit 204 also may include capacitances 248, 250, 252 and 254. Capacitances 248–254 may be configured in parallel with poles 240–246. Capacitances 248–254 also are coupled to ground 290.

Phase shift circuit 204 also includes IN gate 212 and IP gate 214. Gates 212 and 214 may be cross-coupled to the outputs of phase shift circuit 202. For example, IP gate 214 may be coupled to the negative output of phase shift circuit 202, and IN gate 212 may be coupled to the positive output. Gates 212 and 214 also may be coupled to bias and $V_{dd}$ voltage signals 212. Like voltage signals 216, voltage signals 218 may not be limited to the bias and $V_{dd}$ voltages, but may include any other signals used in the operating phase shift circuit 204.

Poles 240–246 are coupled to voltage control signal 270. Poles 240–246 may generate phase shifts, similar to pole 220–226 of phase shift circuit 202. The generated phase shifts of poles 240–246 preferably may be adjustable with a total phase shift approximately equal to one-half of phase shift 260. Poles 240–246 preferably may generate a total phase shift of approximately 90°.

Thus, oscillating circuit 106 may generate a total phase shift using phase shift circuits 202 and 204. For example, this total phase shift may be approximately 360°. Depending upon the desired output signal, for example, poles 220–226 and 240–246 may generate phase shift values that total approximately 180°. Oscillating circuit 106 may produce a desired quadrature output depending upon the poles activated by voltage control signal 270. Depending upon the desired output, either positive or negative outputs may be phase shifted accordingly. As disclosed above, phase shift circuits 202 and 204 may be referred to as stages. In other words, phase shift circuits 202 and 204 may be stages, or delay cells, in oscillating circuit 106. Thus, each stage may provide a delay.

Figure 3A:
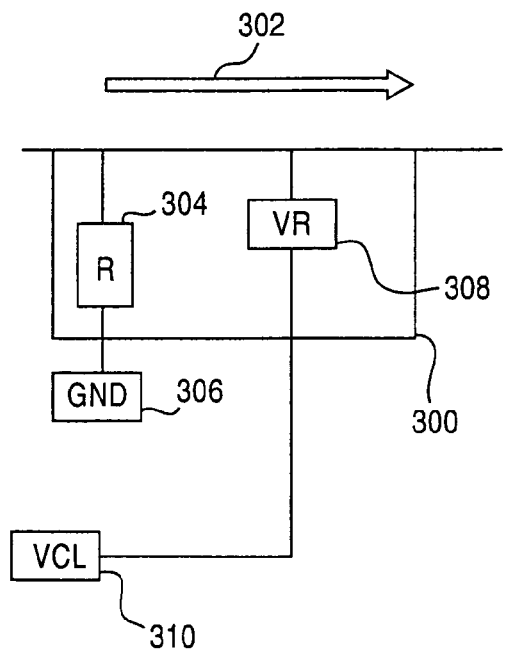
FIG. 3A illustrates a pole within a phase shift circuit according to the preferred embodiments.

FIG. 3A illustrates a circuit configuration for a pole 300 according to the preferred embodiments. Pole 300 correlates to poles 220–226 and 240–246 disclosed with reference to FIG. 2. Pole 300 may be an example of a configuration according to the preferred embodiments of the present invention. Poles 220–226 and 240–246, however, are not limited by the disclosure of pole 300.

Pole 300 may be activated by voltage control signal 320 to generate phase shift 302. Phase shift 302 may be combined with other phase shifts to create a total phase shift. Pole 300 may include resistance 304 and varactor 308. Resistance 304 may be coupled to ground 306. Resistance 304 and varactor 308 may combine to generate a phase shift for phase shift 302. Varactor 308 may be an adjustable element in order to adjust, vary, or tune pole 300.

Varactor 308 may be an n-channel metal oxide semiconductor (NMOS). Alternatively, varactor 308 may be a p-n diode or p-channel MOS. Further, varactor 308 may be an NMOS diode having an NWELL configuration.

Figure 4:
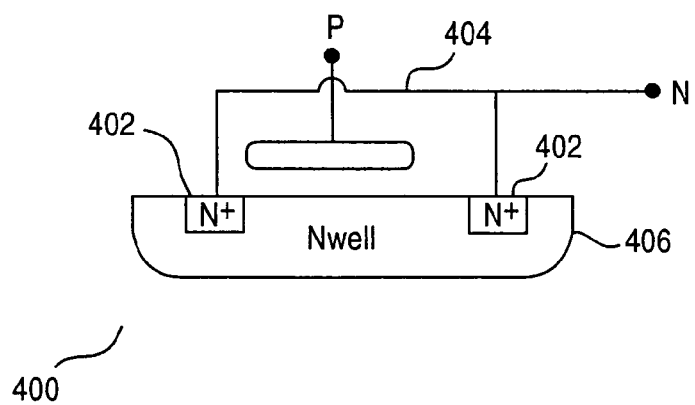
FIG. 4 illustrates a varactor for use in a pole within a phase shift circuit according to the preferred embodiments.

Referring to FIG. 4, NMOS diode 400 may have an NWELL configuration as disclosed according to the preferred embodiments. Gate 404 and N$^+$ contacts 402 may be built on top and inside NWELL 406. Gate 404 and contacts 402 may be the controlling electrode for NMOS diode 400. By applying a positive voltage between gate 404 and NWELL 406, a surface is accumulated such that NMOS 400 capacitance approximately equals the oxide capacitance. The applied voltage may be reversed, and the surface may be depeleted such that the device capacitance of NMOS 400 decreases. Thus, NMOS diode 400 may act a variable capacitor for tuning operations and adjustments in a pole.

Referring back to FIG. 3A, varactor 308 may vary its capacitance in order to adjust phase shift 302. By using the NMOS diode 400 disclosed with reference to FIG. 4, a better Q, or charge, factor may result within a phase shift circuit incorporating pole 300. Further, better noise rejection may result within a larger tuning range. Another feature is a larger maximum current to minimum current ratio, which in turn increases the tuning range. Thus, an oscillating circuit, such as oscillating circuit 106, using pole 300 may have increased performance, noise rejection, and charge factor than conventional oscillating circuits. Further, the threshold for the voltage to produce current charge within varactor 308 is kept at or near approximately zero. Keeping the threshold voltage at or near zero may improve performance of pole 300 in order to allow the voltage to better fit previous stages or subsequent stages. For example, voltage control signal 320 may be applied to multiple stages, or poles, within an oscillating circuit. Keeping the threshold at or near zero may allow the voltage signal 320 to improve performance.

Figure 3B:
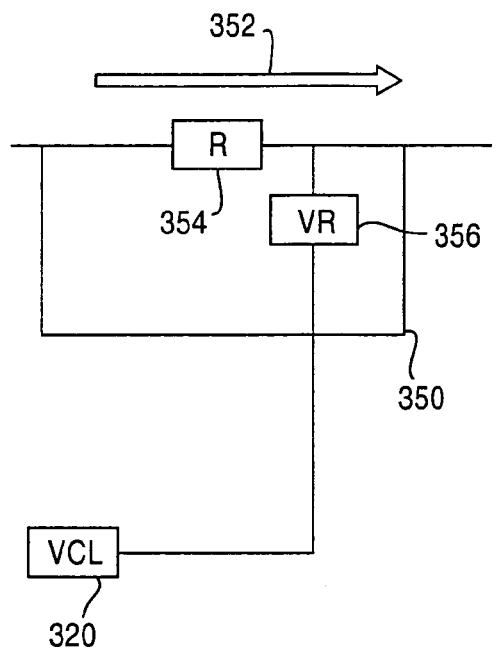
FIG. 3B illustrates another pole circuit within a phase shift circuit according to the preferred embodiments.

FIG. 3B illustrates another circuit configuration for a pole 350 according to the disclosed embodiments. Pole 350 generates phase shift 352. Pole 350 also includes resistance 354 and varactor 356. Varactor 356 may be similar to varactor 308 disclosed with reference to FIG. 3A. Resistance 354 in varactor 356, however, may be configured differently than pole 300. In the configuration disclosed in FIG. 3B, resistance 354 may not be coupled to a ground if phase shift 352 is adjustable, or varied, by varactor 356. Voltage control signal 320 may activate pole 350 to generate phase shift 352.

Though varactors 308 and 356 are disclosed using an NMOS in an NWELL configuration, other diodes and configurations may be implemented within poles 300 and 350 of the present invention. For example, a p-n diode may be used to tune any oscillating circuit using poles 300 or 350. Further, varactors 308 or 356 may use a PMOS in a PWELL configuration in order to generate phase shifts and reduce noise in an oscillating circuit.

One having ordinary skill in the art will readily understand that the invention as discussed above may be practiced with steps in a different order, and/or with hardware elements in configurations which are different than those which are disclosed. Therefore, although the invention has been disclosed based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims and their equivalents.

I claim:

1. An oscillator, comprising:
   a first phase shift circuit including a first pole having a first phase shift and a second pole having a second phase shift, wherein the first phase shift circuit generates a first total phase shift including the first phase shift and the second phase shift; and
   a second phase shift circuit including a third pole having a third phase shift and a fourth pole having a fourth phase shift, wherein the second phase shift circuit generates a second total phase shift including the third phase shift and the fourth phase shift,
   wherein an output of the first phase shift circuit is coupled to an input of the second phase shift circuit, and
   wherein an output of the second phase shift circuit is cross-coupled to an input of the first phase shift circuit.

2. The oscillator of claim 1, further comprising a cross-coupled phase shift approximately equal to the first total phase shift and the second total phase shift.

3. The oscillator of claim 1, wherein the first pole includes a capacitance.

4. The oscillator of claim 3, wherein the capacitance comprises a varactor.

5. The oscillator of claim 4, wherein the varactor comprises a metal oxide semiconductor.

6. The oscillator of claim 5, wherein the metal oxide semiconductor comprises a n-channel metal oxide semiconductor.

7. The oscillator of claim 6, wherein the n-channel metal oxide semiconductor comprises the n-channel metal oxide semiconductor in an NWELL configuration.

8. The oscillator of claim 1, wherein the first phase shift circuit and the second phase shift circuit are configured to generate a quadrature output.

9. The oscillator of claim 8, wherein the quadrature output is generated according to a control signal received at the first and second phase shift circuits.

10. The oscillator of claim 1, wherein the first phase shift circuit further comprises at least one capacitance coupled to at least one of the first pole or the second pole.

11. The oscillator of claim 1, wherein the second phase shift circuit further comprises at least one capacitance coupled to at least one of the third pole or the fourth pole.

12. An oscillator circuit having a cross-coupled configuration, the oscillator circuit comprising:
    a first phase shift circuit;
    a second phase shift circuit to receive an output from the first circuit as an input and having an output cross-coupled to an input of the first phase circuit; and
    at least one pole circuit of a plurality of poles within the first or the second phase circuit, wherein the at least one pole circuit includes a varactor to vary a phase shift generated by the at least one pole circuit.

13. The oscillator circuit of claim 12, wherein the at least one pole circuit comprises a resistance.

14. The oscillator circuit of claim 12, wherein the varactor provides a capacitance to the at least one pole circuit.

15. The oscillator circuit of claim 12, wherein the varactor comprises a metal oxide semiconductor.

16. The oscillator circuit of claim 15, wherein the metal oxide semiconductor comprises an n-channel metal oxide semiconductor.

17. The oscillator circuit of claim 16, wherein the n-channel metal oxide semiconductor is configured to an Nwell configuration within the varactor.

18. The oscillator circuit of claim 12, further comprising a total phase shift for the plurality of poles approximately equal to ½ of a cross-coupled phase shift between the second phase shift circuit and the first phase shift circuit.

19. A transceiver to transmit and receive modulated signals, the transceiver comprising:
    a radio frequency receiver/transmitter;
    an intermediate frequency component coupled to the radio frequency receiver/transmitter to modify a signal to/from the radio frequency receiver/transmitter; and
    an oscillating circuit within the intermediate frequency component to generate a quadrature output signal in response to the signal and including a phase shift circuit having a pole of a plurality of poles, wherein the pole includes a varactor to adjust a phase shift generated by the phase shift circuit.

20. The transceiver of claim 19, further comprising a demodulator coupled to receive the quadrature output signal.

21. The transceiver of claim 19, wherein the oscillating circuit is configured to be a ring oscillator having the phase shift circuit and another phase circuit.

22. The transceiver of claim 21, wherein the ring oscillator comprises the phase shift circuit and the another phase shift circuit in a cross-coupled configuration.

23. The transceiver of claim 19, wherein the varactor comprises a first semiconductor material.

24. The transceiver of claim 23, wherein the first semiconductor material comprises an n-channel metal oxide semiconductor.

25. A method for adjusting a phase shift in a cross-coupled oscillator, the method comprising:
    tuning a varactor in a pole within a phase shift circuit, the phase shift circuit within an oscillator and coupled to another phase shift circuit; and
    changing a phase shift generated by the phase shift circuit according to the varactor.

26. The method of claim 25, wherein the tuning step comprises tuning the varactor, the varactor coupled to a resistance within the pole to generate the phase shift.

27. The method of claim 25, further comprising receiving a control voltage at the varactor.

28. The method of claim 27, further comprising producing an amount of current at the varactor in response to the control voltage.

29. The method of claim 28, wherein the producing step comprises producing the amount of current when the control voltage is at or near a threshold.

30. A circuit for adjusting a phase shift within a phase shift circuit in an cross-coupled oscillator, the method comprising:
    tuning means for tuning a varactor in a pole within a phase shift circuit, the phase shift circuit within an oscillator and coupled to another phase shift circuit; and
    changing means for changing a phase shift generated by the phase shift circuit according to the varactor.

* * * * *